(12) United States Patent
Vatanparast et al.

(10) Patent No.: US 7,881,068 B2
(45) Date of Patent: *Feb. 1, 2011

(54) COMPOSITE LAYER FOR AN ELECTRONIC DEVICE

(75) Inventors: Ramin Vatanparast, Espoo (FI); Mikko Aarras, Helsinki (FI); Steven O. Dunford, Lewisville, TX (US); Takaharu Fujii, Kanagawa (JP); Juhani Lainonen, Espoo (FI); Jaakko Nousiainen, Marttila (FI); Jukka I. Rantala, Espoo (FI); Pia Tanskanen, Helsinki (FI); Tetsuya Yamamoto, Chiba (JP)

(73) Assignee: Nokia Corporation, Espoo (FI)

( * ) Notice: Subject to any disclaimer, the term of this patent is extended or adjusted under 35 U.S.C. 154(b) by 86 days.

This patent is subject to a terminal disclaimer.

(21) Appl. No.: 12/354,536

(22) Filed: Jan. 15, 2009

(65) Prior Publication Data

US 2009/0120672 A1 May 14, 2009

Related U.S. Application Data

(62) Division of application No. 11/121,578, filed on May 4, 2005, now Pat. No. 7,523,546.

(51) Int. Cl.
*H05K 1/18* (2006.01)

(52) U.S. Cl. .................. 361/761; 361/736; 361/737; 361/764

(58) Field of Classification Search ......... 361/736–737, 361/752–753, 814–818
See application file for complete search history.

(56) References Cited

U.S. PATENT DOCUMENTS

| 4,657,137 | A | | 4/1987 | Johnson |
| 4,746,392 | A | * | 5/1988 | Hoppe .................. 156/244.12 |
| 4,784,872 | A | | 11/1988 | Moeller et al. |
| 4,795,898 | A | * | 1/1989 | Bernstein et al. ............ 235/487 |
| 5,026,452 | A | * | 6/1991 | Kodai ........................ 156/293 |
| 5,098,864 | A | | 3/1992 | Mahulikar |

(Continued)

FOREIGN PATENT DOCUMENTS

EP 1 070 545 1/2001

(Continued)

OTHER PUBLICATIONS

Office Action issued in corresponding Chinese Patent Application No. 200680020993.2 on Aug. 7, 2009.

(Continued)

*Primary Examiner*—Tuan T Dinh
(74) *Attorney, Agent, or Firm*—Alston & Bird LLP

(57) ABSTRACT

Provided herein is a composite layer including an electronically functional structural component adapted to integrate a plurality of electronic functions into a laminate cover, layer, and/or laminate component, for protecting, supporting, and/or forming a complete electronic device (such as a multimedia device). The composite layer includes a plurality of structural and/or protective layers interspersed with electronically functional layers or electronic components in communication with the multimedia device to form a supportive and electronically functional layer, cover, protective layer, and/or electronic device. Thus, the composite layer provided allow for the cost-effective addition of thin and lightweight functional, protective, and/or decorative layers to a multimedia device or other electronic device at a sales location or other customization location.

10 Claims, 5 Drawing Sheets

U.S. PATENT DOCUMENTS

| | | |
|---|---|---|
| 6,211,998 B1 | 4/2001 | Sheridon |
| 6,222,513 B1 | 4/2001 | Howard et al. |
| 6,235,395 B1 | 5/2001 | Sacripante et al. |
| 6,251,329 B1 | 6/2001 | Sheridon |
| 6,262,707 B1 | 7/2001 | Sheridon |
| 6,284,352 B1 | 9/2001 | Biegelsen et al. |
| 6,303,211 B1 | 10/2001 | MacKinlay et al. |
| 6,335,818 B1 | 1/2002 | Torres |
| 6,362,915 B1 | 3/2002 | Sheridon et al. |
| 6,388,340 B2 | 5/2002 | Distefano |
| 6,392,785 B1 | 5/2002 | Albert et al. |
| 6,396,621 B1 | 5/2002 | Sheridon |
| 6,400,573 B1 | 6/2002 | Mowatt et al. |
| 6,406,747 B1 | 6/2002 | Biegelsen et al. |
| 6,413,790 B1 | 7/2002 | Duthaler et al. |
| 6,421,035 B1 | 7/2002 | Sheridon et al. |
| 6,422,687 B1 | 7/2002 | Jacobson |
| 6,428,868 B1 | 8/2002 | Sheridon et al. |
| 6,440,252 B1 | 8/2002 | Biegelsen et al. |
| 6,441,946 B1 | 8/2002 | Sheridon |
| 6,456,272 B1 | 9/2002 | Howard et al. |
| 6,485,280 B1 | 11/2002 | Richley |
| 6,488,870 B1 | 12/2002 | Chopra et al. |
| 6,496,298 B1 | 12/2002 | Sheridon et al. |
| 6,498,114 B1 | 12/2002 | Amundson et al. |
| 6,498,674 B1 | 12/2002 | Sheridon |
| 6,504,525 B1 | 1/2003 | Knights |
| 6,524,500 B2 | 2/2003 | Sheridon et al. |
| 6,542,283 B1 | 4/2003 | Sheridon |
| 6,545,671 B1 | 4/2003 | Silverman |
| 6,573,880 B1 | 6/2003 | Simoni et al. |
| 6,690,350 B2 | 2/2004 | Sheridon |
| 6,847,347 B1 | 1/2005 | Kazmaier et al. |
| 6,897,848 B2 | 5/2005 | Sheridon |
| 6,903,719 B2 | 6/2005 | Richley |
| 2002/0148110 A1 | 10/2002 | Blanc et al. |
| 2003/0002132 A1 | 1/2003 | Foucher et al. |
| 2003/0012003 A1* | 1/2003 | Bischof et al. ............. 361/730 |
| 2003/0068840 A1 | 4/2003 | Grigg |
| 2003/0095657 A1 | 5/2003 | Laaksonen |
| 2004/0166607 A1 | 8/2004 | Gregg |
| 2005/0077001 A1 | 4/2005 | Stabile |

FOREIGN PATENT DOCUMENTS

| | | |
|---|---|---|
| EP | 1 118 039 | 2/2003 |
| GB | 2 234 885 | 2/1991 |

OTHER PUBLICATIONS

Second Office Action for Chinese Application No. 200680020993.2 dated Jun. 22, 2010.

* cited by examiner

COMPOSITE LAYER FOR AN ELECTRONIC DEVICE

CROSS-REFERENCE TO RELATED APPLICATIONS

This application is a divisional of U.S. application Ser. No. 11/121,578, filed May 4, 2005 now U.S. Pat. No. 7,523,546, which is hereby incorporated herein in its entirety by reference.

FIELD OF THE INVENTION

The present invention relates generally to the manufacture of mechanical and electronic structures of electronic devices such as multimedia devices and, more particularly, relates to a method for manufacturing covers, structural components, engines, and/or other components of electronic devices wherein electronic connections and conduits are integrated with laminated structures.

BACKGROUND OF THE INVENTION

Modern electronic devices have become more miniaturized as electronic components such as integrated circuits have been decreased in size while having augmented processing power, memory capability, and cooling characteristics. The basic mechanical structure, however, of most multimedia devices, such as, for instance a mobile terminal, has not changed considerably in recent years, thereby limiting the reduction in size and weight of multimedia devices.

For instance, conventional multimedia devices, such as mobile terminals, generally comprise an outer polymeric casing consisting of two or more covers or shells connected to enclose and support one or more circuit boards that, in turn, provide electrical connections between electronic components that may be mounted thereon or otherwise electrically connected thereto. In addition, user interfaces, such as display screens, input keypads, microphones, antennae and other components are also positioned within the polymeric casing as separate components such that they are accessible to the user of the electronic device. Additionally, the advent of more recent electronic technologies, such as RFID chips, miniature digital cameras, and other electronic accessory components, has added to the number of electronic components that must be accommodated within the physical structure of the multimedia device. The outer casing of such conventional electronic devices, however, is designed only to enclose and protect the electronic components and/or circuit boards supported therein, and does not provide for additional functionality. Thus, such conventional devices must bear the weight and size penalty of providing all of the functional electronic components as well as the separate structural casing components used to enclose and support the electronic components.

In order to add electronic functionality to such conventional devices (via the addition of accessory components such as RFID's, lighting elements, antennas, etc.) extra components must be added to the exterior of the outer polymeric casing. This, in turn results in the casing having increased weight and thickness.

Therefore, there exists a need for a method for manufacturing a laminate cover and/or laminate components for reducing the weight and thickness of electronic devices by integrating the functionality of electronic components with the structural functionality of a cover or other laminate component. More particularly, there exists a need for a method of manufacturing a laminate structural component that effectively integrates a plurality of electronic functions into a durable and resilient structure that may be in electrical communication with other electronic components of an electronic device (such as a multimedia device) as well as providing structural and mechanical protection and/or support for the electronic device. In addition, there exists a need for a method of manufacturing a laminate component and/or protective layer that may be used to add additional functional and/or protective layers to a multimedia device or other electronic device after the initial manufacture of the multimedia device or electronic device, such as at a sales location, such that the multimedia device may be customized and/or assembled-to-order (ATO) with one or more additional protective layers having electronic functionality.

SUMMARY OF THE INVENTION

The above and other needs are met by the present invention which, in various embodiments, provides various methods for manufacturing a cover, protective layer, and/or an entire electronic device having a laminate structure wherein electronic components are at least partially embedded within the electronic device, and/or within the cover or protective layer used to encase and/or support an electronic device so as to reduce the overall weight and thickness of the electronic device. According to one embodiment, the method for manufacturing the electronic device (or multimedia device, for example) comprises the steps of attaching at least one electronic component to one side of a first support layer such that a conductive portion of the electronic component is capable of communicating with the multimedia device, applying an adhesive layer to the first support layer, and applying a second support layer to the adhesive layer so as to laminate the at least one electronic component between the first and second support layers to form the electronic device and/or the protective cover or layer for an electronic device. Thus, the method may, in some embodiments, be used to manufacture a laminate layer or other laminate component that is adapted to be capable of operably engaging an electronic device such that the at least one electronic component is capable of communicating with the electronic device via the conductive portion.

According to other method embodiments of the present invention, a method for manufacturing a protective layer for an electronic device is provided. Such a method embodiment comprises the steps of attaching at least one electronic component to a first support layer such that a conductive portion of the electronic component is capable of communicating with the multimedia device, applying an adhesive layer to the first support layer, applying a second flexible support layer to the adhesive layer so as to laminate the at least one electronic component between the first and second flexible support layers to form the protective layer, and wrapping the protective layer about an outer surface of the electronic device such that the at least one electronic component is capable of communicating with the electronic device.

Another embodiment of the present invention provides a method for manufacturing a layer, cover, or other laminate component of an electronic device wherein the components of the layer are advanced, aligned, and selectively laminated together so as to allow the efficient manufacture thereof. Such an embodiment first comprises advancing a first support layer in a first direction wherein the first support layer has at least one electronic component attached to one side thereof such that a conductive portion of the electronic component is capable of communicating with the electronic device, and wherein the first support layer also has an adhesive layer operably engaged with at least a portion of one side of the first support layer. This method also comprises the steps of advancing a second support layer in a direction substantially perpendicular to the first direction such that the second support layer is substantially adjacent to the side of the first support layer having the at least one electronic component attached, and selectively laminating the at least one electronic component between the first and second support layers to form the layer. According to this embodiment, the layer may also be adapted to be capable of operably engaging the electronic device such that the at least one electronic component is capable of communicating with the electronic device via the at least one conductive portion. In addition, such an embodiment provides for the continuous production of such layers by advancing the support layers in a continuous reel (as sub-assemblies) and selectively laminating the support layers together to form layers that may be trimmed off from the continuous assembly line.

In another embodiment, the present invention provides a method of manufacturing a layer or other component of an electronic device using injection molding techniques with the layer having at least one electronic component and/or conductive elements integrated therein. The manufacturing method of this embodiment comprises the steps of placing at least one electronic component on one side of a first carrier layer such that at least one conductive portion of the at least one electronic component is adapted to be capable of communicating with the electronic device, positioning a second carrier layer adjacent to the first carrier layer so as to support the at least one electronic component between the first and second carrier layers and to form a mold for the layer, injecting a molten polymer between the first and second carrier layers, hardening the polymer such that the layer is formed between the first and second carrier layers, and removing the first and second carrier layers from the layer. Thus, the layer formed in this process is capable of operably engaging the electronic device such that the at least one electronic component is capable of communicating with the electronic device via the at least one conductive portion.

In the various method embodiments disclosed above, the methods for manufacturing covers, protective layers for multimedia devices may further include steps for adding conductive elements, fiberoptic elements, keypad devices, conductive apertures, and other electronic functionality to the cover and/or protective layers produced. In addition, various lamination techniques may be used to effectively form the integrated and electronically functional covers, layers, and/or laminate components according to the various embodiments of the methods disclosed herein.

Thus the various method embodiments for manufacturing a cover, protective layer, and/or electronic device of the present invention provide many advantages that may include, but are not limited to: providing a rapid and/or low-cost manufacturing method for producing a cover, protective layer, and/or electronic device having a reduced weight and thickness, providing a method for sealing and/or enclosing an electronic device (such as a multimedia device) with a robust, flexible, covering that may effectively seal the electronic device while providing a number of electronic functions therein; manufacturing a cover, protective layer, and/or electronic device having integrated user-interface capabilities including integrated keypad switches, integrated light-guides, integrated RFID components, and other electronic components that may be in communication with the transmitter, receiver, display, and/or other electronic devices within the electronic device, and providing a method that may be used to cost-effectively customize existing electronic devices at a point-of-sale so as to add additional electronic functions and/or decorative personalization features to the electronic device at a site that is remote from the point of electronic device manufacturing.

These advantages and others that will be evident to those skilled in the art are provided in the methods disclosed herein.

BRIEF DESCRIPTION OF THE DRAWINGS

Figures 1A, 1B:
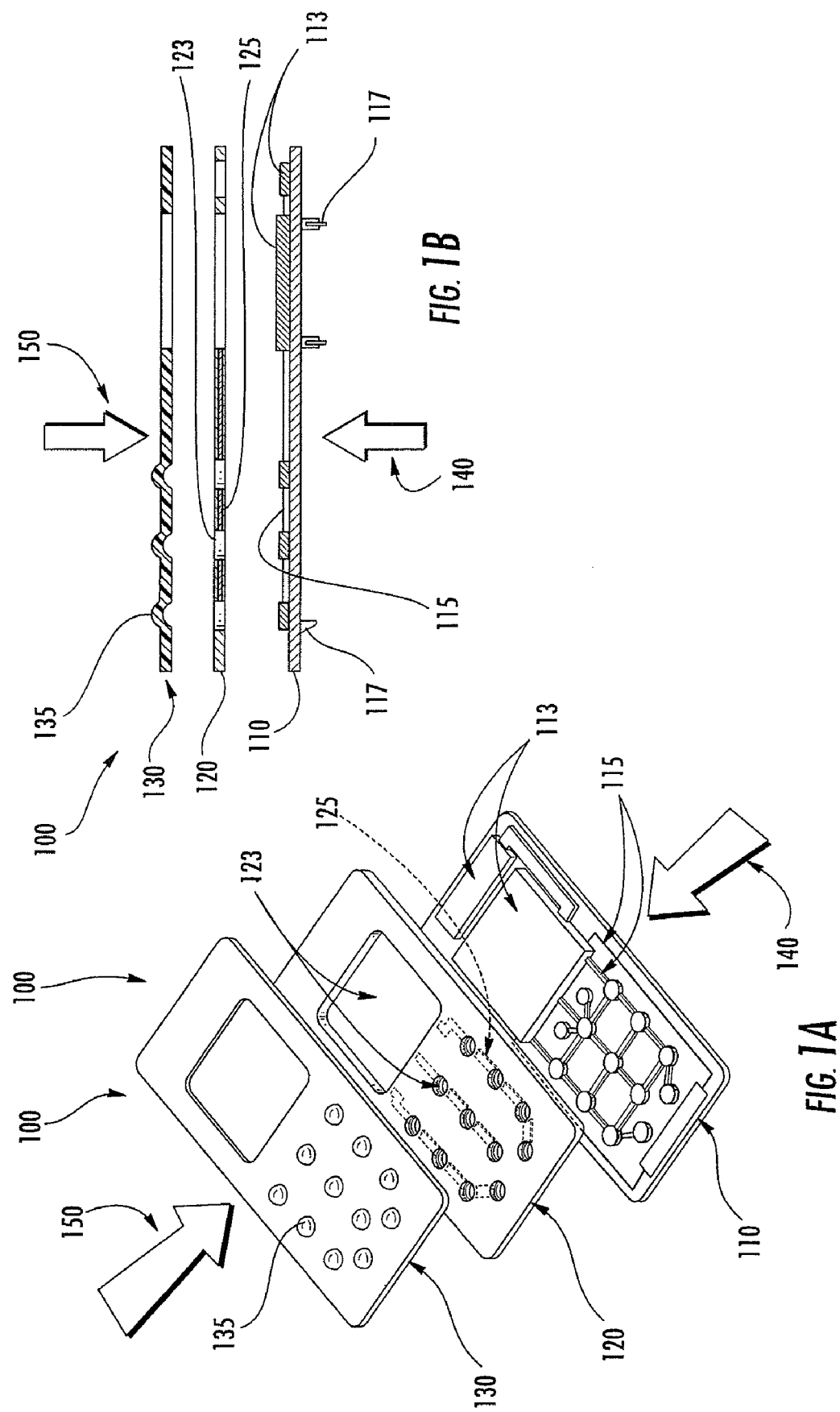
Figure 2:
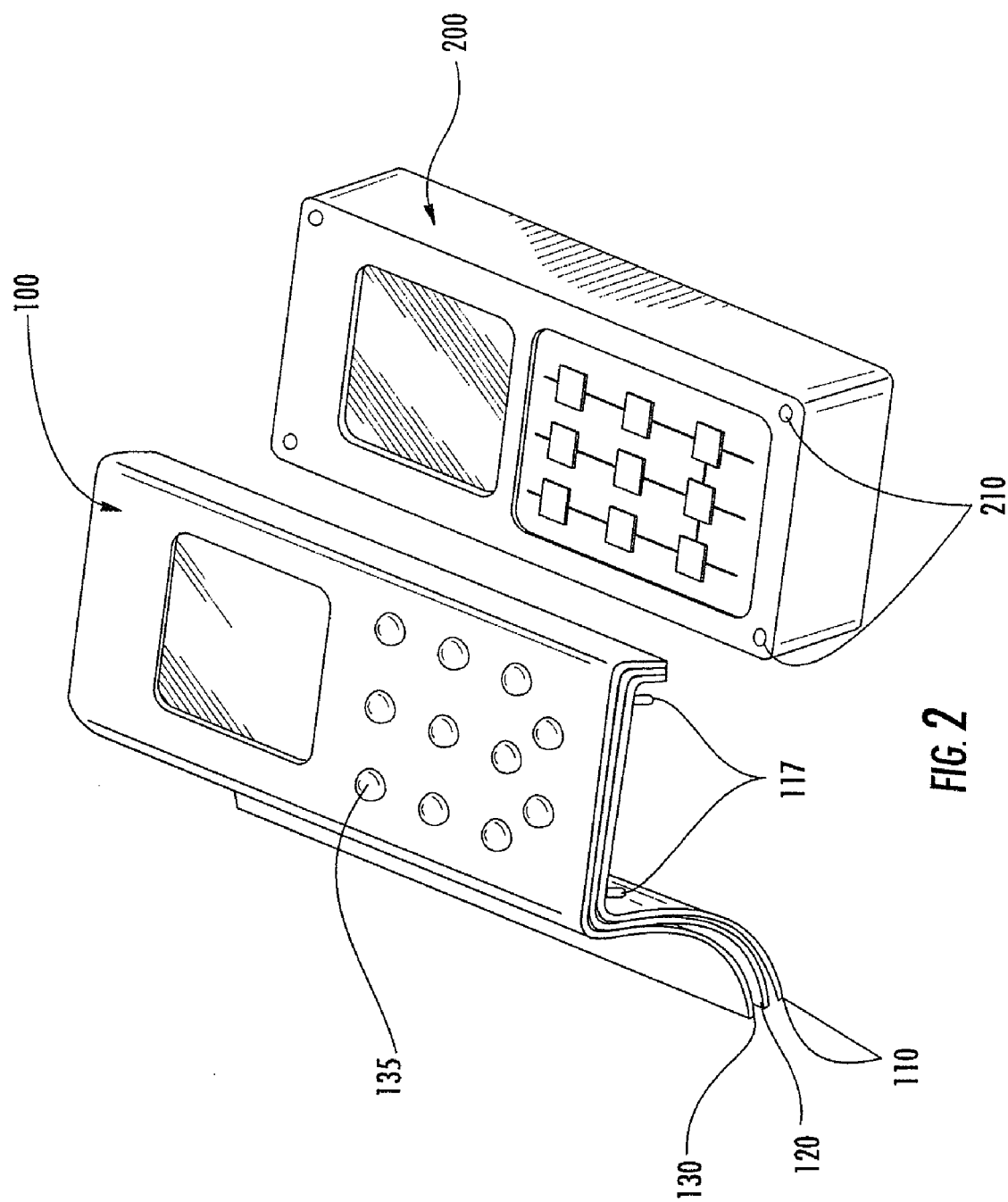
Figure 3:
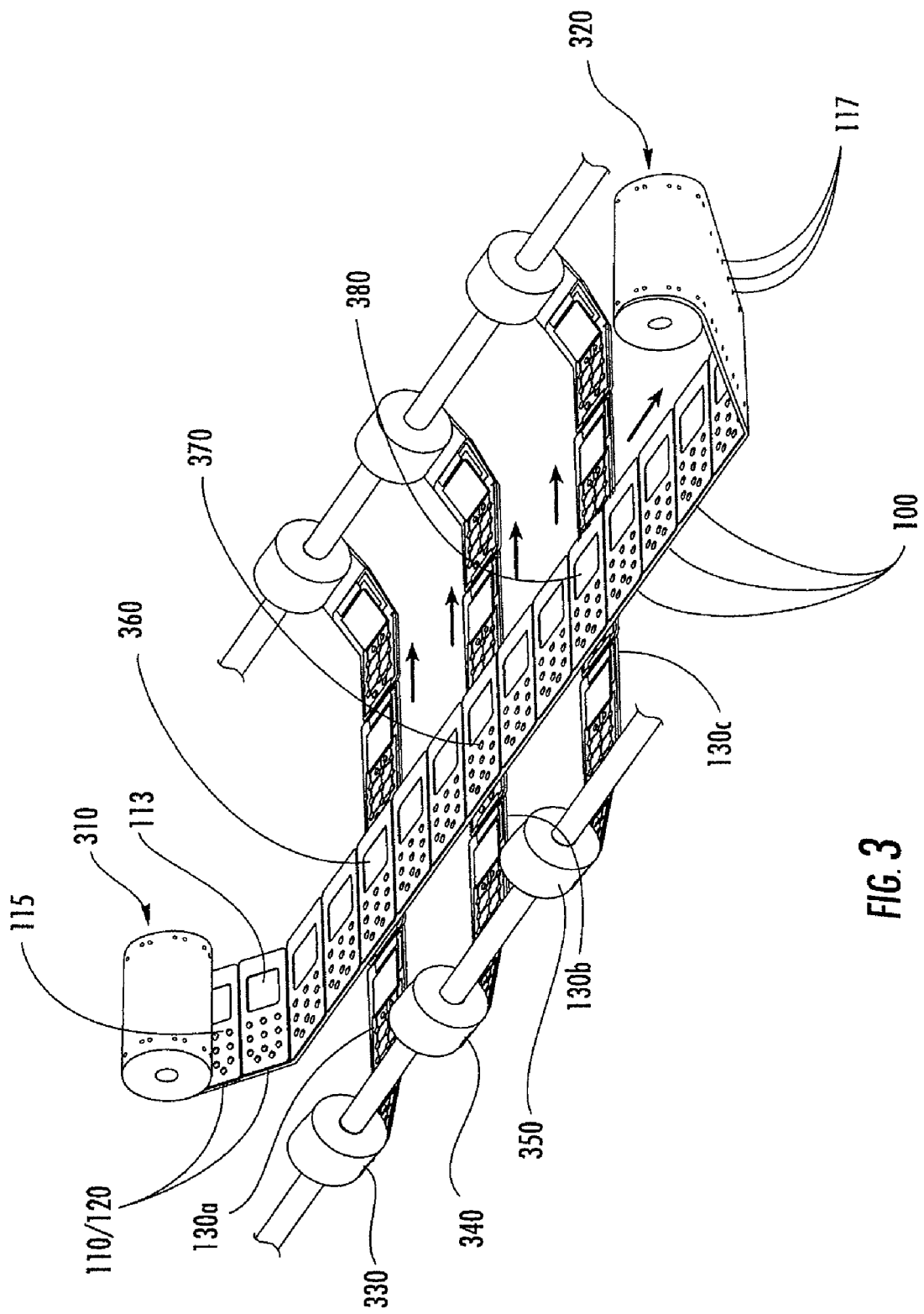
Figure 4:
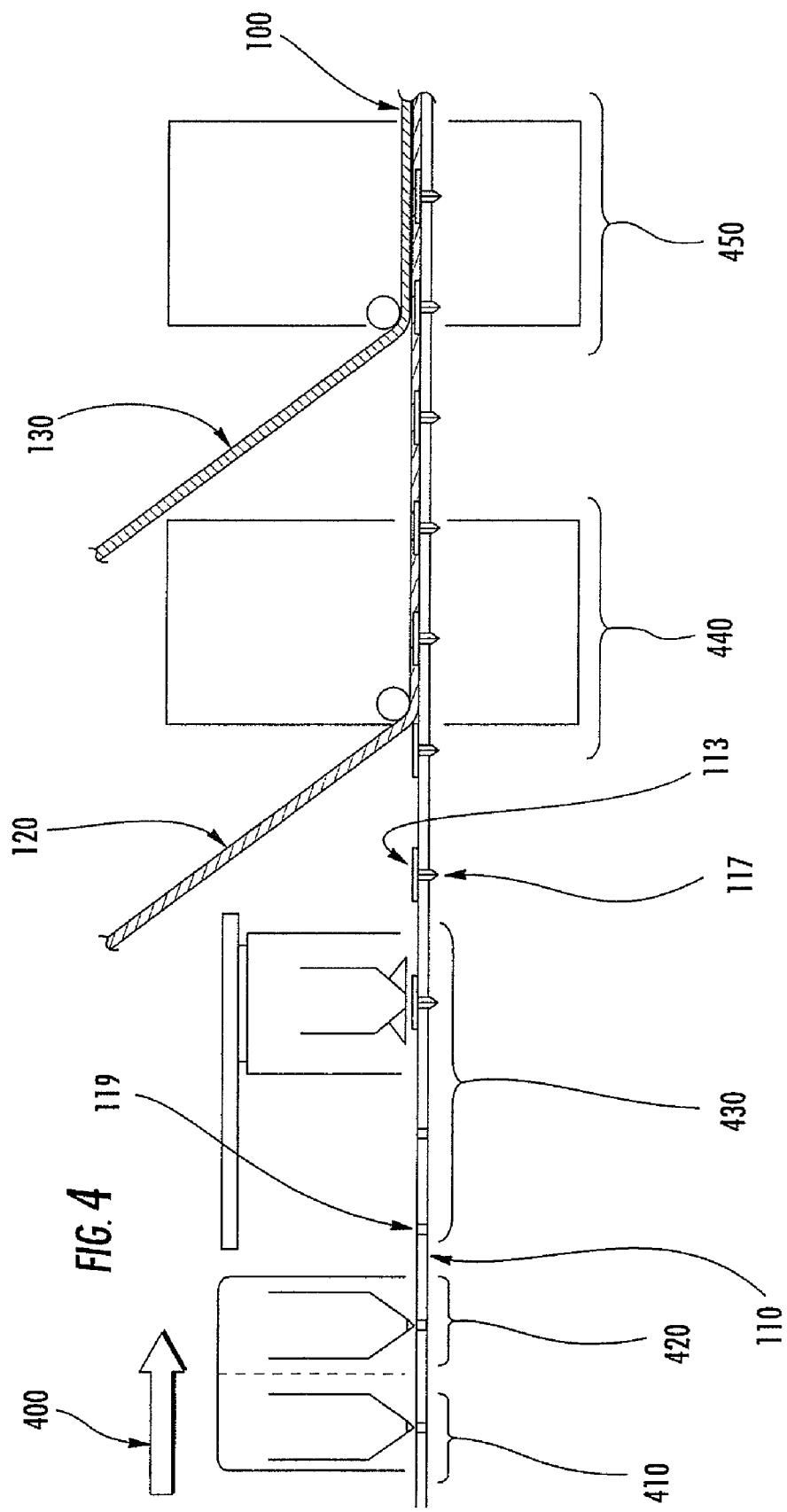
Figure 5:
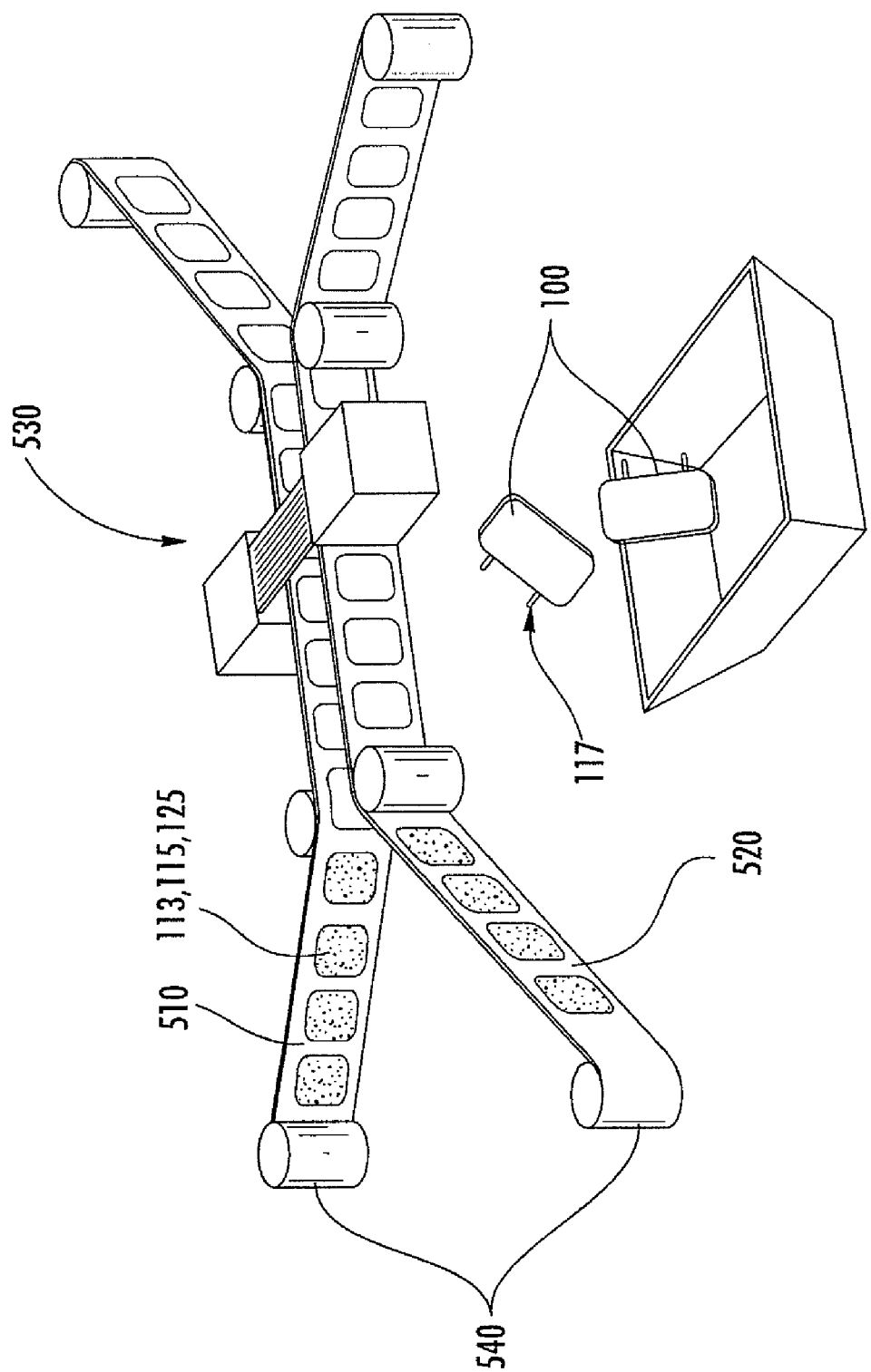

Having thus described the invention in general terms, reference will now be made to the accompanying drawings, which are not necessarily drawn to scale, and wherein:

FIG. 1A shows a perspective view of the manufacturing method for a cover or protective layer according to one embodiment of the present invention wherein the support layers are laminated about an adhesive layer and at least one electronic component;

FIG. 1B shows a side view of the manufacturing method for a cover or protective layer according to one embodiment of the present invention wherein the support layers are laminated about an adhesive layer and at least one electronic component;

FIG. 2 shows a manufacturing method according to one embodiment of the present invention where a laminated protective layer is wrapped about an outer surface of a multimedia device or other electronic device;

FIG. 3 shows a shows a perspective view of the manufacturing method for a cover or protective layer according to one embodiment of the present invention wherein the support layers are selectively laminated about an adhesive layer and at least one electronic component as the support layers are advanced using a reel-to-reel method;

FIG. 4 shows a side view of the manufacturing steps for a method of manufacturing a cover or protective layer according to one embodiment of the present invention; and FIG. 5 shows a perspective view of one embodiment of the method of the present invention wherein injection molding steps are used to manufacture a cover or protective layer for a multimedia device.

DETAILED DESCRIPTION OF THE PREFERRED EMBODIMENT(S)

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

While the methods for manufacturing a cover, protective layer, and/or electronic device are described below in the context of a layer 100 operably engaged with a multimedia device 200 (such as a mobile terminal 200), it should be understood that the embodiments of the present invention may also be utilized to efficiently manufacture a layer 100 and/or protective layer configured to protect, support, and add electronic functionality to a variety of electronic devices 200 that may be advantageously reduced in size, weight, and/or thickness by manufacturing a layer 100 and/or protective cover having integrated electronic components 113. For example, the layer 100 and/or protective layer manufactured according to the method embodiments of the present invention may be operably engaged with a variety of electronic devices, including, but not limited to, PDA devices, watches, portable entertainment devices such as MP3 players, CD players, radios, portable televisions, game systems, or any other electronic device requiring structural support and/or protective covering. It should also be understood that while the method embodiments of the present invention integrate electronic functions related to mobile telephones 200 (such as antenna and keypad functions) into the layer 100 and/or protective layer 510, a number of other types of electronic components 113 (including, for instance, memory chips, LCD screens, thin and lightweight battery modules, and the like) may be integrated into the layer 100 and/or protective layer 510 for providing other electronic functions for electronic devices other than mobile telephones 200. In addition, it should also be understood that the methods of the present invention may also be used to provide a laminate and/or build-up structure for a complete electronic device 200 (such as a multimedia device 200) in addition to layers 100 and/or protective layers for electronic devices 200 as described in detail below.

FIGS. 1A and 1B show a method for manufacturing a layer 100 for an electronic device (such as a multimedia device 200) wherein the layer 100 is configured to include at least one electronic component 113 (such as a display, antenna, or other electronic component) integrated therein. According to one embodiment, the method may include positioning at least one electronic component 113 on one side of a first support layer 110 and adhering or otherwise securing the electronic component 113 to the first support layer 110 such that at least one conductive portion 117 of the electronic component 113 is adapted to communicate with the multimedia device 200 (via, for instance, a conductive aperture 210 (see FIG. 2) defined in the multimedia device 200). For example, an adhesive layer 120 is positioned to the side of the support layer 110 upon which the at least one electronic component 113 is positioned. Finally, the method also comprises applying a second support layer 130 to the adhesive layer 120 so as to laminate the at least one electronic component 113 between the first 110 and second 130 support layers to form the layer 100. The second support layer 130 may be applied using pressure applied from an upper laminating force 150 (applied, for instance, to the second support layer 130), a lower laminating force 140 (applied, for instance, to the first support layer), as well as, in some cases, heat, in order to laminate the at least one electronic component 113 between the first 110 and second 130 support layers to form the layer 100. The layer 100 (or protective layer) produced according to this method is thus capable of being mounted upon or otherwise operably engaging the multimedia device 200 (or other electronic device) such that the at least one electronic component 113 is capable of communicating with the multimedia device 200 via the at least one conductive portion 117. In some alternate embodiments the second support layer 130 may be applied and laminated to the first support layer 110 via a vacuum lamination process, via polyvinyl chloride (PVC) hot melt or ultrasonic thermo-bonding lamination, and/or by the injection molding of ABS plastic between the first and second support layers 110, 130. As described above, the electronically functional layer 100 produced by embodiments of the present invention may also be configured to be capable of communicating with other electronic devices (such as microprocessor chips) to form a complete, sealed electronic device having a reduced cost, time-to-manufacture, weight, and thickness, wherein electronic functionality of the complete electronic device is integrated into the structural laminates 110, 130 of the layer 100.

As shown in FIG. 4, the methods of the present invention may include processing steps 410, 420, 430, 440, 450 performed on the first support layer 110 as it is advanced in a first direction 400. The first support layer 110 may comprise a variety of materials suitable for supporting the electronic components 113 and conductive elements 115 (see Step 430 discussed below) that may be positioned thereon according to the various method embodiments of the present invention. For instance, the support layer 110 may comprise materials selected from the following: metallic foils, flexible polymers (which may be used to construct flexible printed wire board (PWB)), epoxies, substantially rigid polymers (for embodiments requiring less flexible support layers such as a hardened outer cover 100 for conventional multimedia devices 200), and combinations of these and other materials. In addition, in some embodiments, the first support layer 110 may comprise a flexible PWB configured to be capable of flexing and/or stretching to conform to various shapes. Thus, the first support layer 110 may form a resilient core for the layer 100 and/or protective layer of the present invention so as to be capable of absorbing shocks from drops or other impacts that may be imposed upon the multimedia device 200 or other electronic device with which the layer 100 and/or protective layer may be operably engaged according to the various embodiments of the present invention. In other embodiments, the first support layer 110 may comprise a variety of different rigid, semi-rigid, and/or flexible materials suitable for supporting the plurality of electronic components 113 and conductive elements 115 that may be operably engaged therewith. For instance, in some embodiments, the first and/or second support layers 110, 130 may comprise polymers including, but not limited to, polyester teraphthalates (PET), polyethylene naphtalate (PEN), polyphenylene sulfide (PPS), polycarbonates (PC), liquid crystal polymer (LCP), polyimides (PI), fluoroetyhelene propylene (FEP), and/or other suitable materials.

In embodiments wherein the first support layer 110 comprises a flexible PWB or other flexible polymer, the first support layer 110 may be configured to be flexible in three dimensions such that the flexible printed wire board and the second support layer 130 are capable of conforming to the multimedia device 200 (as, for instance, a flexibly conforming protective layer 100 that may be wrapped about the multimedia device 200) (see FIG. 2). According to such embodiments (as discussed below), the first support layer 110 may be provided in the form of a supply roll 310 so as to be configured to be capable of being selective unrolled and advanced in a first direction 400 such that additional support layers 130*a*, 130*b*, 130*c* may be selectively laminated at several lamination points 360, 370, 380 to the first support layer 110 as the first support layer 110 is advanced in the first direction 400 in order to form a substantially flexible protective layer 100 that may be subsequently collected on a collection roll 320. Thus, as discussed in detail below, and as shown generally in FIG. 2, the resulting substantially flexible protective layer 100 may be unrolled and cut from the collection roll 320 so as to be available for wrapping about (and/or otherwise operably engaging) a multimedia device 200 (as shown in FIG. 2).

As shown in FIGS. 1A and 1B, in some embodiments (such as, for example, wherein the first support layer 110 and second support layer 130 comprise substantially rigid and/or semi-rigid materials (such as conventional PWB materials and laminating polymers)), the layer 100 may be manufactured on a per-piece basis using the lamination technique shown generally in FIG. 1B wherein an adhesive layer 120 and a second support layer 130 are applied to a substantially rigid first support layer 110 (carrying at least one electronic component 113 and various conductive elements 115) so as to laminate (via vacuum lamination, hot melt lamination, injection molding, or other lamination techniques that will be appreciated by one skilled in the art) the at least one electronic component 113 between the support layers 110, 130 to form a layer 100 having electronic functionality and substantially rigid mechanical characteristics suitable for supporting, sealing, and/or protecting a multimedia device 200. Furthermore, the lamination process shown generally in FIG. 1B also allows for the communication between the at least one electronic component 113 and the electronic devices (or attached conductive elements) that may be disposed within the multimedia device 200 via the conductive portions 117 of the at least one electronic component 113 that may, in some embodiments, extend outwardly from the laminated structure of the layer 100 or in other embodiments, operably engage one or more apertures 119 that may be defined in the first support layer 110 (as described in step 410, below).

In the various method embodiments of the present invention, the first support layer 110 may be subjected to a number of manufacturing steps prior to the application of a subsequent support layer 130 or layers as shown generally in FIG. 4. First, in step 410, one manufacturing method may comprise defining at least one aperture 119 in the first support layer. In some embodiments, the aperture 119 may be defined in the first support layer 110 and configured to receive a conductive portion 117 of the at least one electronic component 113 so as to recess the at least one electronic component 113 within the first support layer 110 (as shown in FIG. 4). In some instances, the aperture 119 may comprise a conductive via or micro via configured to receive a conductive portion 117 of the at least one electronic component 113. Thus, according to some embodiments, the at least one electronic component 113 may be operably engaged (as in step 430 described below) with the first support layer 110 such that its corresponding conductive portion 117 extends through the aperture 119 to engage a conductive aperture 210 (see FIG. 2) that may be defined in the chassis or other structure of the multimedia device 200. In other embodiments, however, the defining step of step 410 may further comprise defining at least one conductive aperture 119 such that the at least one electronic component 113 may be operably engaged with the first support layer 110 such that the conductive portion 117 (and consequently, the corresponding at least one electronic component 113) is seated within the conductive aperture such that the conductive portion 117 is in contact with a conductive surface of the conductive aperture 119 but does not extend through the thickness of the first support layer 110. In such embodiments, the defining step 410 may define a conductive aperture 119 that may be operably engaged with a conductive pin or other male connector that may be adapted to outwardly extend from the chassis or other mechanical structure of the multimedia device 200 such that the at least one electronic component 110 may be in communication with the multimedia device 200. The defining step 410 may also further comprise defining an aperture 119 (or conductive aperture) in the first support layer using methods including laser drilling and metallizing, applying conductive ink plugs (to an aperture 119 defined by either mechanical drilling or laser drilling, for instance), and/or forming an aperture using a number of different techniques that will be appreciated by those skilled the art for defining vias, micro-vias, and other conductive apertures 119 in a first support layer 110 (such as a PWB or flexible PWB).

The defining step 410 described above may also comprise defining one or more apertures 119 in the second support layer 130 so as to allow the addition of at least one electronic component 113 to the surface of the second support layer 130 so as to enable the second support layer 130 to serve as a basis for the addition of additional layers to the layer 100 produced by the steps of the method of the present invention. Thus, step 410 may be performed on the second support layer 130 of a completed layer 100 so as to allow for communication among the following: at least one electronic component 113 carried by the second (and third, etc.) support layer 130, electronic components 113 carried by the first support layer 110, and electronic devices (such as, for instance, the display, engine, memory, etc.) disposed within the chassis or other mechanical structure of the multimedia device 200. Thus, as shown generally in FIG. 3, (and as described in detail below) additional, electronically functional, support layers 130a, 130b, 130c may be added to the first support layer 110, wherein each support layer may have various electronic components 113 and conductive elements 115 operably engaged therewith; all of which may be capable of communicating with the multimedia device 200 via the apertures 119 defined in the support layers according to step 410.

Referring again to FIG. 4, step 420 comprises applying a plurality of conductive elements 115 to one side of the first support layer 110 so as to allow communication between the at least one electronic component 113 and other electronic components 113 that may be operably engaged with the support layer 110 (as described below in step 430). For instance, in some embodiments, step 420 may comprise applying one or more conductive elements 115 to one side of the first support layer 110 such that the conductive elements 115 may allow continuous contact and electronic communication between various electronic components 113 that may be seated within and/or operably engaged with various apertures 119 (and/or conductive apertures) defined as part of step 410 described above. According to the various method embodiments of the present invention, step 420 may comprise applying the conductive elements 115 to the first support layer 110 by a variety of additive or subtractive etching methods. For instance, the conductive elements 115 may be plated, printed, etched, and/or hard wired to the support layer 110 so as to be capable of enabling communication between the electronic components 113 and/or with the conductive apertures 119 defined in the support layers 110 as part of step 410. In some method embodiments, step 420 may further comprise printing the conductive elements 115 on one side of the support layer 110. In such embodiments, the conductive elements 115 may comprise, for instance, printable conductive inks suitable for being printed onto a first support layer 110 (such as a PWB or flexible PWB) wherein the conductive inks may comprise, for instance, metallic nanoparticles and/or sintered metallic nanoparticles, electrically conductive laser printer toner, electrically conductive carbon nanotubes, and combinations thereof. In some embodiments, step 420 may further comprise applying some or all of the conductive elements using precision deposition techniques, such as, for example via Micro-Deposition Direct-Write (MDDW) methods.

In other embodiments, step 420 may further comprise applying a plurality of flexible fiberoptic elements across the support layer 110. As described below in step 440, flexible fiberoptic elements may also be disposed within the adhesive layer 130. The fiberoptic elements may be applied (and secured using various adhesive materials) and configured so as to be capable of transmitting a light signal that is visually perceptible. The fiberoptic elements may be applied to form, for instance, light conduits, light guides, optical wave guides, or illumination layers. The fiberoptic elements and/or the adhesive layers 130 (see step 440, below) may also form, for instance, illumination layers and/or light conduits suitable for transmitting light (via, in some instances, internal reflection) from an LED or other light emitting electronic component 113 (including, for example, OLED, RCLED, NRCLED, laser incandescent lighting elements, fluorescent lighting elements, or an optical fiber transmitting an optical signal from such a component).

Step 430, according to the method embodiment shown generally in FIG. 4, comprises positioning at least one electronic component 113 upon and securing at least one electronic component 113 to one side of the first support layer 110. As described above, the at least one electronic component 113 may include at least one conductive portion 117 wherein the at least one conductive portion is adapted to communicate with the multimedia device 200 via the aperture 119 defined in the first support layer 110 (in step 410) and/or via an extended conductive portion 117 configured to be capable of extending through the first support layer 110 as shown generally in FIG. 1B so as to be capable of communicating with the multimedia device 200. Also, as described generally above, the electronic component 113 may be operably engaged with the aperture 119 defined in step 410 such that the electronic component 113 is recessed and/or otherwise laterally supported within the support layer 110 such that the at least one electronic component 113 may be securely seated and/or secured prior to the application of an adhesive layer 120 and second support layer 130 as part of steps 440 and 450, respectively. Thus, according to some embodiments, the operably engaging step 430 of the present invention may comprise a pick-and-place automated process wherein the at least one electronic component 113 is obtained by an automated system (such as a robotic assembly) and automatically placed into a position on the first support layer 110 and defined, in some instances, by the aperture 119 defined in the first support layer 110 as part of step 410 described above. The electronic components 113 may be operably engaged with the first support layer 110 by a variety of other automatic, semi-automatic, and/or manual methods known in the art and suitable for ensuring the proper placement and seating of the at least one electronic component 113 on the first support layer 110 so as to further ensure continuous communication between the electronic component 113 with the conductive elements 115 and/or conductive apertures 119 disposed on and/or defined in the first support layer 110. In addition, step 430 may further comprise securing the at least one electronic component 113 to the first support layer 110 using adhesives, soldering processes, and other attachment methods. For instance, in some method embodiments, step 430 may comprise automatically placing the at least one electronic component 113 into a pre-defined aperture 119 (and/or recessed area) defined in the first support layer 110 (produced in, for instance, step 410 as described above) and subsequently automatically soldering the electronic component 113 into place such that the conductive portion 117 of the electronic component 113 is either fully seated in the aperture 119 or is in communication with a conductive aperture 119 so as to be capable of communicating with the multimedia device 200 as well as being laterally and vertically secured to the first support layer 110.

The electronic components 113 disposed on the first support layer 110 may include a variety of components configured to provide various electronic functionality to the multimedia device 200 even though the electronic components 113 are included (and/or embedded) in the layer 100 due to the processes described herein, thereby simplifying the design of the remainder of the multimedia device 200. Such electronic components 113 may include, for instance, LED devices, antennae, RFID devices, electromechanical switches (such as those actuated by actuation members 135 described below and shown generally in FIGS. 1A and 1B), microphones, displays (such as thin LCD displays and others), speakers, and other electronic components 113 that may be configured to be in communication with the multimedia device 200. As described above, the various electronic components 113 may be operably engaged with the first support layer 110 so as to be in communication with the multimedia device 200 via conductive apertures 119 (such as plated vias or micro-vias) defined, for instance, in one or more of the support layers 110, 130 of the layer 100. In addition, the electronic components 113 disposed on the first support layer 110 may also be in communication with each other (and with the conductive apertures 119) via the plurality of conductive elements 115 also extending across the opposed surfaces of the support layers 110, 130.

Step 440 comprises applying an adhesive layer 120 to the side of the first support layer 110 that carries the at least one electronic component 113. As shown generally in FIG. 4, the applying step 440 may comprise applying a pre-formed sheet of uncured adhesive in an adhesive layer 120 that may be advanced and applied using a roller device or press mechanism so as to secure the uncured adhesive layer 120 to the first support layer 110. The adhesive layer 120 may comprise pre-formed apertures corresponding to the position of electronic components 113 that are carried by the support layer 110 such that the adhesive layer 110 may be applied around the electronic component 113. Moreover, the adhesive layer 120 is advantageously sized such that the top surface of the adhesive layer 120 applied in step 440 is substantially flush with a top surface of the at least one electronic component 113. In addition, the applying step 440 may further comprise pre-heating or pre-curing the adhesive layer 120 such that it may at least partially adhere to the first support layer 110 so as to be laterally secured to the first support layer 110 as part of step 440. The adhesive layer 120 applied in step 440 may comprise any adhesive suitable for electronic applications, including, for example, a heat-cured or chemically-cured epoxy, a methacrylate, or, in some instances (as described below) a clear adhesive capable of forming one or more translucent pathways 125 (see FIG. 1A). The adhesive layer may comprise a number of thermoset materials including, but not limited to, acrylics, cyanoacrylates, polyurethanes, epoxies, epoxyacrylates, or other suitable adhesive types. The adhesive layer may also be introduced between the support layers 110, 130, in some embodiments, in a melted, liquefied, and/or partially melted form (such as, for example, ABS polymer, that may be injection molded between the first and second support layers 110, 130) so as to more fully fill the cavities and apertures defined between the support layers 110, 130. In such embodiments, the electronic components 113, translucent pathways 125, and/or conductive portions 117 may be protected during the molding process by a preformed mold configured to confine the injection molded material to a selected area or areas defined between the support layers 110, 130 (as described in further detail with respect to FIG. 5).

The adhesive layer 130 is configured to attach the first support layer 110 to the second support layer 130 (see step 450 below) so as to form a laminated unitary structure from the various layers of the protective layer of this aspect of the present invention. Also, the layer 100 formed by methods of the present invention may comprise additional adhesive layers 130 disposed between the second support layer 130a and additional support layers 130b, 130c as shown generally in FIG. 3, so that the resulting multi-layered protective layer 100 forms a unitary structure having electronic functionality provided by the electronic components 113 disposed on one or more of the support layers 130a, 130b and sealed therein by the outermost support layer 130c.

According to some embodiments, step 440 may comprise applying the adhesive layer 120 (or layers) and forming a plurality of translucent pathways 125 (see FIG. 1A) (or lightguides) therein configured to be capable of transmitting a light signal that is visually perceptible. The pathways 125 may be in communication with electronic components 113, and, more particularly, opto-electronic components, disposed on the support layer 110 (such as LEDs or other light-emitting components). The translucent pathways 125 transmit light signals to varied portions of the layer 100 such as individual actuation members 135 (see FIG. 1B) (serving as user keys, for instance) or display devices so as to be capable of backlighting the display device. In addition, the pathways 125 may also be configured to transmit light signals for other purposes, such as to provide visual ring indicators for a multimedia device 200 or to provide pulsed and/or constant ornamental lighting for the multimedia device 200 or other electronic device with which the layer 100 may be operably engaged. In various method embodiments of the present invention, applying the adhesive layer 120 in step 440 may comprise various dispensing and/or printing processes that are suitable for creating an adhesive layer 120 (and the translucent pathways 125, defined therein) including both additive and subtractive methods for applying the adhesive layer 120. For instance, translucent pathways 125 may be applied directly to the first support layer 110 to form the adhesive layer 120 in step 440 using various methods, including, for example, dipping techniques, dispensing, gravure, offset techniques, jet, spray, pad printing, silkscreen, powder coating, patterned etching techniques and/or other methods suitable for applying and or forming an adhesive layer 120 on the first support layer 110 that may, in some instances, also comprise translucent pathways 125 as described above. In some instances, the adhesive layer(s) 120 may also be formed in step 440 so as to include illumination layers and/or light conduits suitable for transmitting light (via, in some instances, internal reflection) from an LED or other light emitting electronic component 113 (including, for example, OLED, RCLED, NRCLED, laser incandescent lighting elements, fluorescent lighting elements, or an optical fiber transmitting an optical signal from such a component).

In some embodiments, the adhesive layers 120 and, more particularly, the translucent pathways 125, may be formed in step 440 using the methods described above (or using other suitable processes) for transmitting signals in the IR or near-IR spectrum. In yet another embodiment, the adhesive layers 120 may also be applied such that they are formed with one or more light escape elements configured to disrupt internal reflections in the translucent pathways 125 and to direct the light outside of the translucent pathways 125 such that the light escape elements may be configured to provide visible and/or IR illumination that is external to the layer 100 and/or multimedia device 200 so as to provide decorative diffuse lighting, backlighting, and or remote IR signal transmission capability. In some embodiments, the light escape elements may be formed in step 440 to comprise a diffusive surface area or a diffractive element inserted or formed within the translucent pathways 125.

Also referring to FIG. 4, step 450 comprises applying a second support layer 130 over the adhesive layer 120 so as to laminate the at least one electronic component 113 between the first and second support layers 110, 130 to form the layer 100. As shown in FIG. 4, the second support layer 130 may be advanced in a first direction 400 parallel to the advance of the first support layer 110 and passed though a laminating device (such as a vacuum laminator, low-temperature laminator, or other suitable device) such that the second support layer 130 may be laminated with the first support layer 110 so as to enclose the electronic component 113 within the finished layer 113. Step 450 may also comprise at least partially heating one or both of the second support layer 130 and the adhesive layer 120 so as to cure the adhesive layer 120 and/or cause the second support layer 130 to shrink about the first support layer 110, electronic component 113, and adhesive layer 120 (in embodiments wherein the second support layer 130 comprises a substantially flexible heat-shrink material).

According to various embodiments of the present invention, the second support layer 130 (in a manner similar to the first support layer 110 and/or other additional support layers 130a, 130b, 130c (see FIG. 3)) may comprise a variety of materials suitable for supporting additional layers of electronic components 113 and/or conductive elements 115 that may be operably engaged therewith according to the various method embodiments of the present invention. For instance, the second support layer 130 may comprise materials selected from the following: metallic foils, flexible polymers (which may be used to construct flexible PWBs as described above), epoxies, substantially rigid polymers (for embodiments requiring less flexible support layers such as a hardened outer cover 100 for conventional multimedia devices 200), heat-shrink polymers and other substantially flexible materials suitable for wrapping about and conforming to the multimedia device 200, and combinations of these and other materials. In additional embodiments, the second support layer 130 may comprise polymers including, but not limited to, polyester teraphthalates (PET), polyethylene naphtalate (PEN), polyphenylene sulfide (PPS), polycarbonates (PC), liquid crystal polymer (LCP), polyimides (PI), fluoroetyhelene propylene (FEP), and/or other suitable materials. In addition, in some embodiments, the first support layer 110 may comprise a flexible printable wire board (PWB) configured to be capable of flexing and/or stretching to conform to various shapes. In other embodiments, the second support layer 130 may comprise a flexible surface layer or other substantially flexible material configured to be capable of being rolled and/or unrolled from a supply roll 330, 340, 350 so as to be capable of being wrapped about and/or conforming to the other layers 110, 120 of the layer 100 that may be applied according to the previous steps of the present invention.

As shown in FIG. 3, multiple support layers 130a, 130b, 130c may be applied to the first support layer 110 and selectively laminated thereto to form the layer 100 using the methods of the present invention. For instance, according to one embodiment, a roll-to-roll manufacturing method may be utilized to form a multi-layer protective layer 100 using the method steps of the present invention wherein the method comprises advancing a first support layer 110 in a first direction 400, wherein the first support layer 110 includes at least one electronic component 113 operably engaged therewith such that at least one conductive portion of the at least one electronic component 113 is adapted to be capable of communicating with the multimedia device 200 following manufacture and assembly. The first support layer 110 also includes an adhesive layer 120 operably engaged with at least a portion of the first support layer 110. In some instances, the at least one electronic component 113 and the adhesive layer 120 may be applied using method steps such as those described above in steps 430 and 440, respectively.

The first support layer 110 may be advanced as it is unrolled from a supply roll 310 as shown in FIG. 3. The method may further comprise advancing one or more second support layer(s) 130a, 130b, 130c in a second direction 315, substantially perpendicular to the first direction 400 such that the second support layer 130a, 130b, 130c is substantially adjacent to the side of the first support layer 110 having the at least one electronic component 110 operably engaged therewith. In some embodiments, a set of intermediate second support layers 130a, 130b may be applied to the first support layer 110 also having one or more electronic components 113, conductive elements 115, adhesive layers 120, and other components preapplied thereto using, for instance, the method steps shown above in FIG. 4. For example, the support layers 130a, 130b may comprise flexible polymer substrates (or flexible PWBs) that are configured to be capable of being formed into corresponding supply rolls 330, 340, 350 that may be advanced in a second direction 315, substantially perpendicular to the first direction 400 such that the second support layers 130a, 130b, 130c are substantially adjacent to the side of the first support layer 110. Finally, as described above in step 450, the second support layers 130a, 130b, 130c may be selectively laminated at one or more laminating points 360, 370, 380 (corresponding, for instance, to the area of intersection of the first support layer 110 and the second support layers 130a, 130b, 130c) so as to laminate the at least one electronic component 113 between the first and second support layers 110, 130a, 130b, 130c to form the layer 100 and/or a flexible protective layer that may be collected and formed onto a collection roll 320 as shown in FIG. 3.

As shown generally in FIGS. 1A and 1B, the outermost support layer 130c may be applied to the layer 100 having no additional components or features applied thereto so as to form an outer protective layer that may, in some embodiments, comprise a translucent and/or color polymer suitable for transmitting light (from, for instance, the translucent pathways 125 defined in the adhesive layer 120 disposed immediately below the outermost support layer 130c) and/or providing a customizable color-matched layer for the exterior shell of a multimedia device 200.

In addition, in some embodiments, the outermost support layer 130c may be preformed with a plurality of flexible actuation members 135 (or flexible keys, forming a keypad or other user interface) as shown generally in FIG. 1B. Thus, the methods of the present invention may further comprise the step of forming a plurality of flexible actuation members 135 in the second support layer 130 (or the outermost support layer 130c, as shown in FIG. 3), and positioning the plurality of flexible actuation members 135 relative to the first support layer 110 such that the plurality of flexible actuation members 135 are capable of selectively contacting the conductive elements 115 (disposed, for instance, on the first support layer 110) upon being actuated. For example, in some embodiments, the outermost support layer 130 may be pre-formed (using polymer molding techniques, heat treatments, and/or other molding methods) to define a plurality of flexible actuation members 135 (such as, for instance, flexible convex multimedia device keys arranged as a keypad) positioned to be capable of selectively contacting respective conductive elements 115 disposed on the first support layer 110 upon being pressed and/or inwardly deformed by a user. The actuation members 135 may further comprise a conductive element that faces and is configured to contact the conductive elements 115 disposed on the first support layer 110 (or alternatively, the support layer 130b directly below the outermost support layer 130c) once the actuation member 135 is deformed by a downward force (such as the fingertip pressure applied by a user). Thus, the conductive elements of the actuation member 135 and the conductive elements 115 of the first support layer 110, respectively, may be selectively brought into contact so as to provide switching and/or actuating capability to the layer 100, such as by interconnecting a pair of conductive elements 115 disposed on the first support layer 110 by means of the conductive element carried on an inner surface of the convex shape of the actuation member 135. Thus, using the actuation member 135, a user may actuate one or more electronic devices 113 disposed within the layer 100 or otherwise within the multimedia device 100. In such embodiments, the actuation members 135 may be grouped into a numeric keypad, power switch, or other function switches such that the layer 100 may provide integrated user-interface capabilities to the multimedia device 200 or other electronic device with which it may be operably engaged.

Thus, as shown in FIG. 3, a plurality of layers 100 and/or protective layers configured to be capable of being mounted to or otherwise operably engaging a corresponding plurality of multimedia devices 200 (or other electronic devices) may be stored in the form of a collection roll 320 and which may be unrolled and subsequently trimmed such that each respective layer 100 and/or protective layer (which may be flexible and/or conformable to the multimedia device) may be cut from the collection roll 320 and wrapped about a multimedia device 200 as shown generally in FIG. 2. The resulting layer may be adapted to be capable of operably engaging the multimedia device 200 such that the at least one electronic component 113 is capable of communicating with the multimedia device 200 via the at least one conductive portion 117 which may be in communication with the various electronic devices disposed within the chassis and/or other mechanical structure of the multimedia device 200 via, for instance, one or more apertures 119 that may be defined in the first support layer 110 (and/or other support layers 130a, 130b, 130c according to step 410 of one embodiment of the present invention (illustrated schematically in FIG. 4).

Using the method embodiments described herein and shown generally in FIGS. 3 and 4, various support layers 130a, 130b, 130c (having one or more specialized electronic components 113 disposed thereon) may be applied and/or laminated to a base first support layer 110 also having one or more electronic components 113 disposed thereon to form a customizable layer 100 and/or protective layer having varied electronic functionality due to the communication (via integrated apertures 119, translucent pathways 125, and/or conductive elements 115) of the electronic components 113 with the electronic devices disposed within the chassis and/or other mechanical structures of the multimedia device 200. For instance, one or more of the second support layers 130a 130b, 130c depicted in FIG. 3 may be replaced with an alternate second support layer 130 having alternate electronic components 113 (and thus, having alternate electronic functionality) disposed thereon that may be selectively added to the layer 100 and/or protective layer produced using method embodiments of the present invention. Thus, the method embodiments of the present invention may be used to produce layers 100, covers, and/or protective layers for multimedia devices 200 or other electronic devices that may be customized at a site other than the factory at which the multimedia device 200 is fabricated using the methods and techniques disclosed herein. In addition, the methods generally disclosed herein may allow a multimedia device 200 user to customize the appearance and/or functionality of their multimedia device 200 by selectively adding support layers 130 having the desired electronic components 113 that may be laminated and/or wrapped about their existing multimedia device 200 (or multimedia device cover 100) at a site that is remote from the original manufacturing site of the multimedia device 200 (such as a vending site or retailer for mobile terminals 200 or other multimedia devices) using the method embodiments disclosed herein.

FIG. 5 shows an alternate embodiment of the method of the present invention wherein a layer 100 (such as a substantially rigid cover) for a multimedia device 200 may be rapidly and economically manufactured, wherein the layer 100 produced has electronic functionality integrated into its structure. The method embodiment shown generally in FIG. 5 comprises the steps of supporting at least one electronic component 113 (and/or corresponding conductive elements 115 and translucent pathways 125) upon one side of a first support layer 510. As before, the at least one electronic component 113 includes at least one conductive portion 117 that is adapted to communicate with the multimedia device 200. A second carrier layer 520 is then positioned adjacent to the first carrier layer such that the at least one electronic component 113 is positioned between the first and second carrier layers 510, 520. The juxtaposed first and second carrier layers 510, 520 thereby form a mold for the cover 100; into which a polymer is injected (using an injection molding apparatus 530 or other mechanism suitable for producing, handling, and/or dispensing molten polymer, such as, for example, ABS plastic). The polymer hardens (via cross-linking, curing, water and/or air cooling, etc.) such that the cover 100 is formed between the first and second carrier layers 510, 520. The first and second carrier layers 510, 520 may then be removed from the cover 100 such that the resulting cover 100 is capable of operably engaging a multimedia device 200 such that the at least one electronic component 113 is capable of communicating with the multimedia device 200 via the at least one conductive portion 117.

The steps of the injection molding method described above and shown in FIG. 5 may further comprise a variety of injection molding techniques suitable for injecting a molten polymer about a plurality of (in some cases) fragile electronic components 113 (and/or associated conductive elements 115 or fiberoptic components associated therewith) to form a cover 100 for a multimedia device 200 made of rigid and/or semi-rigid polymer. As described, the resulting cover 100 may contain integrated electronics that may be capable of communicating with the multimedia device 200 via, for instance, conduits, vias, and/or apertures that may be formed into the molded cover 100. For instance, the injecting step of the method described above may further comprise injecting low-melt polymers or other relatively cool injection molding techniques about the electronic components 113 (and associated conductive elements 115) that may be supported between the support layers 510, 520. In addition, as shown in FIG. 5, the support layers 510, 520 may be advanced stepwise through an injection molding apparatus 530 such that a plurality of covers 100 may be produced relatively quickly by systematically advancing a pre-set configuration of electronic components 113 (along with the support layer 510) to a point adjacent to the opposing and correspondingly advancing second support layer 520 such that the first and second support layers 510, 520 may form an injection mold about the electronic components 113 such that a finished molded cover 100 (once cooled) may be ejected from the injection molding apparatus 530 after being separated from the support layers 520, 530. According to some embodiments, the support layers 510, 520 may comprise materials (such as PTFE sheet or other non-stick materials) that may easily release the molded cover 100 following the heating and cooling cycles associated with injection molding and subsequent cooling and hardening.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An apparatus comprising:
    a first support layer;
    at least one electronic component positioned on one side of the first support layer, the at least one electronic component including at least one conductive portion, the at least one conductive portion being adapted to communicate with an electronic device;
    an adhesive layer disposed on the side of the first support layer carrying the at least one electronic component; and
    a second support layer disposed on the adhesive layer so that the at least one electronic component is laminated between the first and second support layers to form a composite layer, the composite layer being adapted to operably engage the electronic device such that the at least one electronic component is capable of communicating with the electronic device via the at least one conductive portion
    wherein the first support layer defines at least one aperture, the at least one aperture configured to receive the at least one conductive portion of the at least one electronic component such that the at least one electronic component is recessed within the first support layer.

2. An apparatus according to claim 1 further comprising a plurality of conductive elements disposed on the side of the first support layer carrying the at least one electronic component.

3. An apparatus according to claim 1 wherein at least one conductive aperture is defined using a process selected from the group consisting of:
    laser drilling and metallizing;
    applying conductive ink plugs; and
    combinations thereof.

4. An apparatus according to claim 1 wherein the at least one electronic component is attached to the first support layer with adhesives, solders or combinations thereof.

5. An apparatus according to claim 1 wherein the second support layer is disposed using a process selected from the group consisting of:
    vacuum laminating;
    low-temperature laminating; and
    combinations thereof.

6. An apparatus according to claim 1 wherein the adhesive layer comprises a plurality of translucent pathways that are configured to communicate with the at least one electronic component and are also configured to transmit a light signal that is visually perceptible.

7. An apparatus according to claim 1 further comprising at least one flexible fiberoptic element disposed on one side of the first support layer, the at least one flexible fiberoptic element configured to communicate with the at least one electronic component and also configured to transmit a light signal that is visually perceptible.

8. An apparatus according to claim 1 further comprising at least one flexible actuation member in the second support layer, wherein the at least one flexible actuation member is positioned relative to the first support layer such that the at least one flexible actuation member is configured to selectively contact the respective conductive element upon being actuated.

9. An apparatus according to claim 1, wherein the first and second support layers comprise substantially flexible materials.

10. An apparatus according to claim 2 wherein the conductive elements are disposed using a process selected from the group consisting of:
    conductive inkjet printing;
    polymer thick-layer printing;
    vacuum sputtering;
    laser direct imaging;
    direct metallizing;
    micro-deposition direct-write (MDDW); and
    combinations thereof.

* * * * *